United States Patent [19]

Suzuki et al.

[11] Patent Number: 5,762,749

[45] Date of Patent: Jun. 9, 1998

[54] APPARATUS FOR REMOVING LIQUID FROM SUBSTRATES

[75] Inventors: Satoshi Suzuki; Mitsuaki Yoshitani; Yoshio Matsumura; Yasuhiro Akita; Hiroshi Yamamoto, all of Shiga-ken, Japan

[73] Assignee: Dainippon Screen Mfg. Co., Ltd., Japan

[21] Appl. No.: 677,924

[22] Filed: Jul. 10, 1996

[30] Foreign Application Priority Data

Jul. 21, 1995 [JP] Japan ..................... 7-207434

[51] Int. Cl.⁶ .................................... B44C 1/22
[52] U.S. Cl. .................................... 156/345; 216/92
[58] Field of Search .................. 134/30, 37, 102.2; 156/345 L; 216/92

[56] References Cited

U.S. PATENT DOCUMENTS 3,935,041  1/1976  Goffredo et al. ............... 216/92

FOREIGN PATENT DOCUMENTS 4-48621  4/1992  Japan .

7-14819  1/1995  Japan .

*Primary Examiner*—William Powell
*Attorney, Agent, or Firm*—Ostrolenk, Faber, Gerb & Soffen, LLP

[57] ABSTRACT

An apparatus for removing a treating liquid from main surfaces of a substrate that has undergone a wet surface treatment, includes a transport device for transporting the substrate, a first gas jetting device having a first jet opening for jetting a gas to a first main, upper surface of the substrate transported by the transport device, and a liquid removing chamber for preventing the treating liquid removed from the main surfaces of the substrate from scattering to ambient, the liquid removing chamber having a substrate inlet and a substrate outlet. A partition is mounted in the liquid removing chamber, with an upper end thereof contacting either an upper wall, a rear wall or a front wall of the liquid removing chamber. The partition extends between opposite side walls of the chamber parallel to direction of substrate transport. The partition divides an interior space of the chamber above the first main surface of the substrate into a first space upstream of the first jet opening with respect to the direction of substrate transport, and a second space downstream of the first jet opening with respect to the direction of substrate transport.

20 Claims, 8 Drawing Sheets

APPARATUS FOR REMOVING LIQUID FROM SUBSTRATES

BACKGROUND OF THE INVENTION

1. Field of the Invention

This invention relates to apparatus for removing a treating liquid or solution from main surfaces of substrates after wet surface treatment thereof, and particularly from main surfaces of glass substrates for liquid crystal displays, glass substrates for photomasks, printed circuit boards or semiconductor wafers.

2. Description of the Related Art

Figure 1:
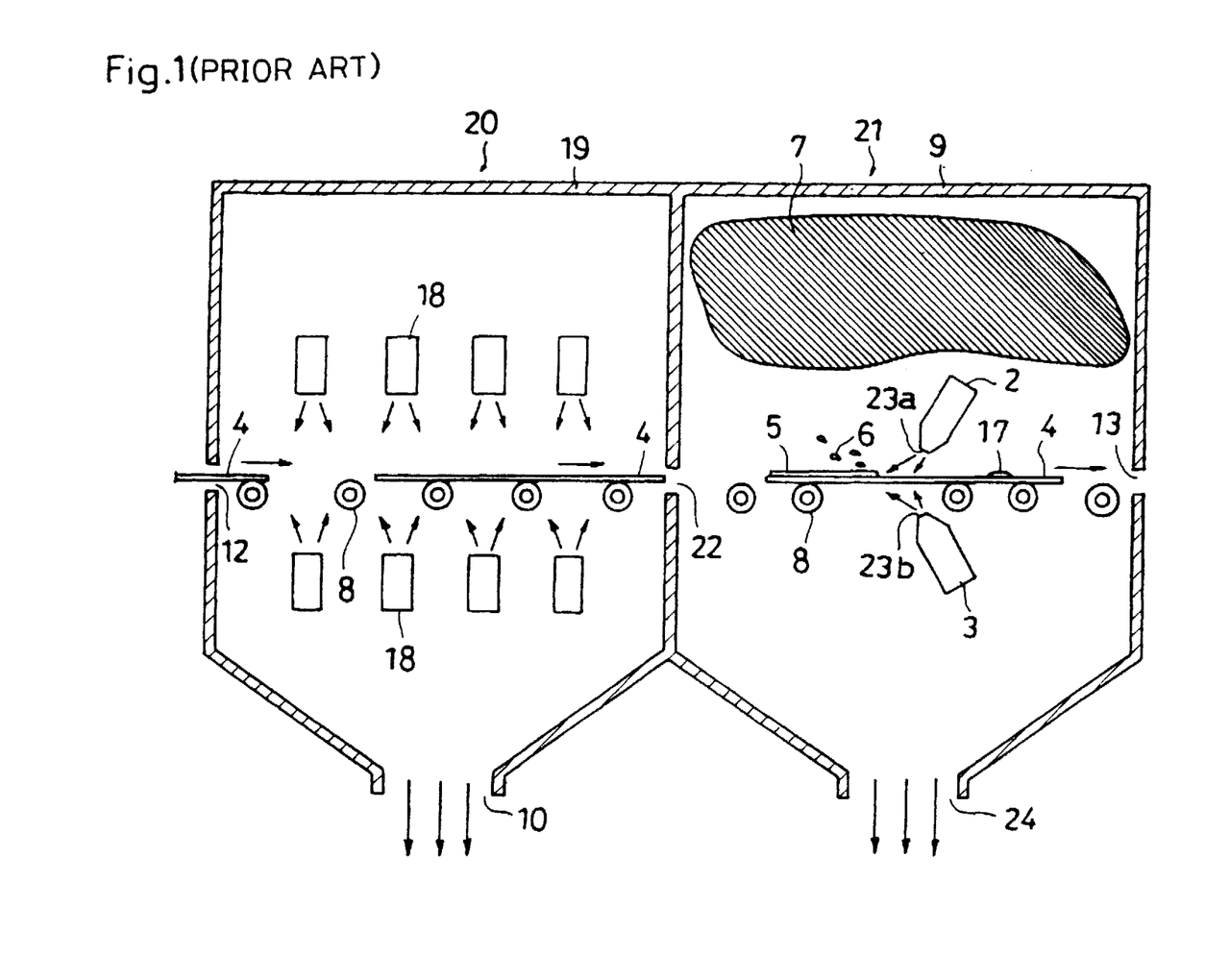
FIG. 1 is a side view of a cleaning apparatus and a liquid removing apparatus in the prior art.

Liquid crystal displays, photomasks or the like are manufactured through a process including varied wet surface treatments in which predetermined treating liquids or solutions are supplied to glass substrates. For example of such wet surface treatments is a cleaning treatment in which cleaning apparatus supplies a cleaning liquid such as deionized water to surfaces of substrates to clean the substrate surfaces. Subsequently, a gas is blown at the cleaned substrate surfaces to remove the cleaning liquid therefrom. FIG. 1 shows a liquid removing apparatus proposed heretofore for performing this liquid removing treatment.

The illustrated conventional treating system includes a cleaning apparatus 20 includes a plurality of transport rollers 8 arranged in a cleaning chamber 19 for transporting square substrates 4 in horizontal posture in the direction indicated by arrows immediately above substrates 4. A plurality of nozzles 18 are also arranged in the cleaning chamber 19 for supplying a cleaning liquid such as deionized water to opposite surfaces of the substrates.

A liquid removing apparatus 21 has a plurality of transport rollers 8 arranged in a liquid removing chamber 9, and first and second air knife 3 for jetting a gas to the opposite surfaces of the substrates transported by the transport rollers 8. The air knives 2 and 3 define a first slit-shaped jet opening 23a and a second slit-shaped jet opening 23b, respectively.

The cleaning chamber 19 and liquid removing chamber 9 define a first exhaust opening 10 and a second exhaust opening 24 in bottom regions thereof, respectively, for exhausting air and draining the cleaning liquid therefrom.

In the conventional liquid removing apparatus 21 shown in FIG. 1, the gas is blown from the first air knife 2 to the upper surface of each substrate 4 to remove cleaning liquid 5 therefrom. At this time, the cleaning liquid 5 is scattered under the pressure of the gas blown from the first air knife 2. Scattering cleaning liquid 6 turns into mist 7 which floats over the substrate 4. The mist 7 adheres to the upper surface of substrate 4 stripped of the cleaning liquid. Mist 17 adhering to the substrate 4 remains on the upper surface of substrate 4 as local stains in film form. These stains may be separated from the substrate surface in a subsequent manufacturing process to produce undesirable particles in a treating chamber. Otherwise the stains are obstructive to formation of elements on the substrate. These drawbacks result in a low yield of products such as liquid crystal displays or photomasks.

In order to eliminate the above inconvenience, it is conceivable to minimize generation of mist 7 by reducing the pressure for jetting the gas from the first air knife 2. In this case, however, an extended time is required for removing the cleaning liquid 5 from the upper surface of each substrate 4. The substrates 4 cannot be transported at high speed. Thus, this measure results in a different drawback of hampering a high liquid removing performance.

In another proposal made heretofore, a shielding plate is mounted on an air knife (the first air knife) disposed above a plane of substrate transport to prevent mist from adhering to substrates after liquid removing treatment. The shielding plate has one long side thereof fixed at an angle to an upper position of the air knife. The shielding plate has a length smaller than a distance between opposite inner walls of the liquid removing chamber extending parallel to a direction of substrate transport. An upper edge of the shielding plate is in contact with an inner wall of the liquid removing chamber. However, mist will enter a rearward region of the chamber through gaps between the shielding plate and the inner walls of the chamber, and adhere to the substrates after the liquid removing treatment.

SUMMARY OF THE INVENTION

The instant invention has been made having regard to the state of the art noted above, and the object of the instant invention is to provide an apparatus for removing liquid from substrates, in which mist generating from a treating liquid or solution scattered by a gas blown from a gas jetting device to surfaces of washed substrates is prevented from adhering to the substrate surfaces, to realize an increased yield of products and an improved liquid removing performance.

The above object is fulfilled, according to this invention, by an apparatus for removing a treating liquid from main surfaces of a substrate having undergone wet surface treatment. Such apparatus comprises:

- a transport device for supporting the substrate in a substantially horizontal posture and transporting the substrate in a direction along the main surfaces thereof;
- a first gas jetting device having a first jet opening for jetting a gas to a first main, upper surface of the substrate transported by the transport device;
- an approximately box-shaped liquid removing chamber for preventing treating liquid that is removed from the main surfaces of the substrate from scattering to ambient, the liquid removing chamber having a substrate inlet and a substrate outlet; and
- a first partition mounted in the liquid removing chamber and having an upper end thereof contacting one of an upper wall, a rear wall and a front wall of the liquid removing chamber, and extending between opposite side walls of the liquid removing chamber parallel to the direction of substrate transport, to divide an interior space above the first main surface of the substrate into a first space upstream of the first jet opening with respect to the direction of substrate transport, and a second space downstream of the first jet opening with respect to the direction of substrate transport.

A substrate having treating liquid adhering to its surfaces is transported by the transport device in a substantially horizontal posture and in a direction along the surfaces through the substrate inlet of the liquid removing chamber. In the liquid removing chamber, a gas is jetted from the first jet opening of the first gas jetting device to the first main surface, i.e. upper surface, of the substrate to blow the treating liquid away from this surface. Part of the treating liquid that is removed turns into mist to float in the liquid removing chamber. The mist floats in the first space opposed to the first main surface of the substrate and upstream of the first jet opening with respect to the direction of substrate transport. The first space having the mist afloat therein is separated by the first partition from the second space opposed to the first main surface of the substrate and downstream of the first jet opening with respect to the direction of substrate transport. The first partition is mounted in the liquid removing chamber, with an upper end thereof contacting the upper wall, rear wall or front wall of the liquid removing chamber, and extends between the opposite side walls parallel to the direction of substrate transport. That is, the first space and second space above the substrate are closed tight by the partition except for a gap between the first jet opening of the first gas jetting device and the first main surface of the substrate. Consequently, the mist floating in the first space is reliably prevented from entering the second space. The substrate stripped of the treating liquid is free from adhesion of the mist.

Thus, the mist of the treating liquid scattered during liquid removing treatment is prevented from adhering to the first main surface of the substrate after the treatment, to realize an increased yield of products. Since the first partition is provided to prevent the mist from adhering to the substrate after the liquid removing treatment, the gas may be jetted out of the (first) gas jetting device under a greater pressure than in the prior art. This is effective to reduce the time required to conduct the liquid removing treatment. Thus, the substrate may be transported at increased speed to improve the capacity of the liquid removing treatment.

Preferably, the above apparatus further comprises a second gas jetting device having a second jet opening for jetting the gas to a second main, lower surface of the substrate transported by the transport device, and a second partition mounted in the liquid removing chamber and having a lower end thereof contacting one of a lower wall, the rear wall and the front wall of the liquid removing chamber. The second partition extends between the opposite side walls, to divide an interior space below the second main surface of the substrate into a third space upstream of the second jet opening with respect to the direction of substrate transport, and a fourth space downstream of the second jet opening with respect to the direction of substrate transport.

While the gas is jetted from the first jet opening of the first gas jetting device to the first main surface, i.e. upper surface of the substrate, to blow the treating liquid away therefrom, the gas is jetted also from the second jet opening of the second gas jetting device to the second main surface, i.e. lower surface of the substrate, to blow the treating liquid away from this surface. A phenomenon similar to what takes place opposite the first main surface takes place opposite the second main surface. That is, the treating liquid blown away from the second main surface forms mist to float below the second main surface of the substrate. This mist could of course adhere to the second main surface of the substrate. However, the third space upstream of the second jet opening with respect to the direction of substrate transport is separated by the second partition from the fourth space downstream of the second jet opening with respect to the direction of substrate transport. The second partition is mounted in the liquid removing chamber, with a lower end thereof contacting the lower wall, rear wall or front wall of the liquid removing chamber, and extends between the opposite side walls parallel to the direction of substrate transport. That is, the third space and fourth space below the substrate in the liquid removing chamber are closed tight except for a gap between the second jet opening of the second gas jetting device and the second main surface of the substrate. Consequently, the mist floating in the third space is prevented effectively from entering the fourth space. The substrate stripped of the treating liquid is free from adhesion of the mist to the first main surface and second main surface thereof.

Thus, the mist of the treating liquid scattered during the liquid removing treatment is prevented from adhering to the first and second main surfaces of the substrate after the treatment. This apparatus can effectively remove liquid from the opposite surfaces (first and second main surfaces) of the substrate after wet treatment, resulting in increased yield of products. Since the first and second partitions are provided to prevent the mist from adhering to the substrate after the liquid removing treatment, the gas may be jetted out of the (first and second) gas jetting devices under a greater pressure than in the prior art. This is effective to substantially reduce the time required for the liquid removing treatment. Thus, the substrate may be transported at increased speed to improve production of the liquid removing treatment.

Preferably, the first jet opening and the second jet opening have a length larger than a width of the substrate in a direction perpendicular to the direction of substrate transport.

With this construction, the gas is supplied from the first and second jet openings in jets having a width that is larger than the width of the substrate. The gas jets are applied uniformly over the entire areas of the first and second main surfaces of the substrate. Consequently, the treating liquid is removed from the substrate efficiently.

This apparatus may further comprise a draft gas device for supplying gas flows downward to the second space.

The draft gas device feeds a gas downward to the second space in the liquid removing chamber to produce gas flows from the second space to the first space. These gas flows prevent the mist from flowing from the first space into the second space, and constantly fill the second space with clean gas. Thus, the substrate is maintained clean after the liquid removing treatment, free from contamination by particles and the like.

Preferably, the draft gas device includes a draft gas opening formed above the second space, and a filter mounted in the draft gas opening.

Usually, gentle gas downflows are present in a cleanroom. The draft gas opening allows such downflows to enter the second space after being cleaned by the filter. Thus, gas flows traveling from the second space to the first space are produced without an additional device for generating gas flows.

The draft gas device may further include a fan for feeding air through the filter.

With the filter retarding downflows from the cleanroom, insufficient gas flows may occur only from the second space to the first space. The fan may be operated to compensate for the retardation to realize an appropriate flow rate. The fan is operable with an adjustable rotational frequency to supply gas flows at an appropriate flow rate according to surface condition of a substrate stripped of the treating liquid.

Preferably, the liquid removing chamber includes an exhaust opening for discharging air therefrom.

With this construction, the mist may be discharged from the liquid removing chamber as entrained by gas flows exhausted through the exhaust opening. Thus, the mist is prevented from adhering to the substrate.

The first partition may define an upper portion of the rear wall above a plane of substrate transport, and the second partition may define a lower portion of the rear wall below the plane of substrate transport, the substrate outlet being defined in a space between the first gas jetting device and the second gas jetting device.

With the first and second partitions forming the rear wall of the liquid removing chamber, and with the substrate outlet defined between the first and second gas jetting devices, the second space is opposed to the first main surface of the substrate and downstream of the first jet opening of the first gas jetting device with respect to the direction of substrate transport, and the fourth space is opposed to the second main surface of the substrate and downstream of the second jet opening of the second gas jetting device with respect to the direction of substrate transport, and both the first and second gas jetting devices are disposed outside and rearwardly of the liquid removing chamber. This construction is effective to the mist from flowing above the first gas jetting device into the second space, and from flowing below the second gas jetting device into the fourth space. With the first and second partitions also acting as the rear wall of the liquid removing chamber, the apparatus has a reduced number of components to realize a simplified construction.

Preferably, the first gas jetting device and the second gas jetting device are inclined such that the first jet opening and the second jet opening are directed upstream with respect to the direction of substrate transport.

It is also preferable to have the first gas jetting device and the second gas jetting device arranged at a predetermined angle to a line extending perpendicular to the direction of substrate transport. With the gas jetting out at an angle to the direction of substrate transport, the treating liquid is driven to a corner of the substrate. In this way, the treating liquid is removed efficiently from the substrate.

Preferably, the liquid removing chamber, the first partition and the second partition are given antistatic treatment. When the liquid removing chamber and the first and second partitions are charged with static electricity, particles and mist floating in the liquid removing chamber are attracted to and accumulate on inner walls of the liquid removing chamber and the partitions. The particles and mist accumulating thereon may be thrown up by the gas flows in the liquid removing chamber, and adhere to and contaminate the substrate. Such inconvenience may be avoided by providing antistatic treatment for these components.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENTS

Preferred embodiments of this invention will be described in detail hereinafter with reference to the drawings.

First Embodiment

Figure 2:
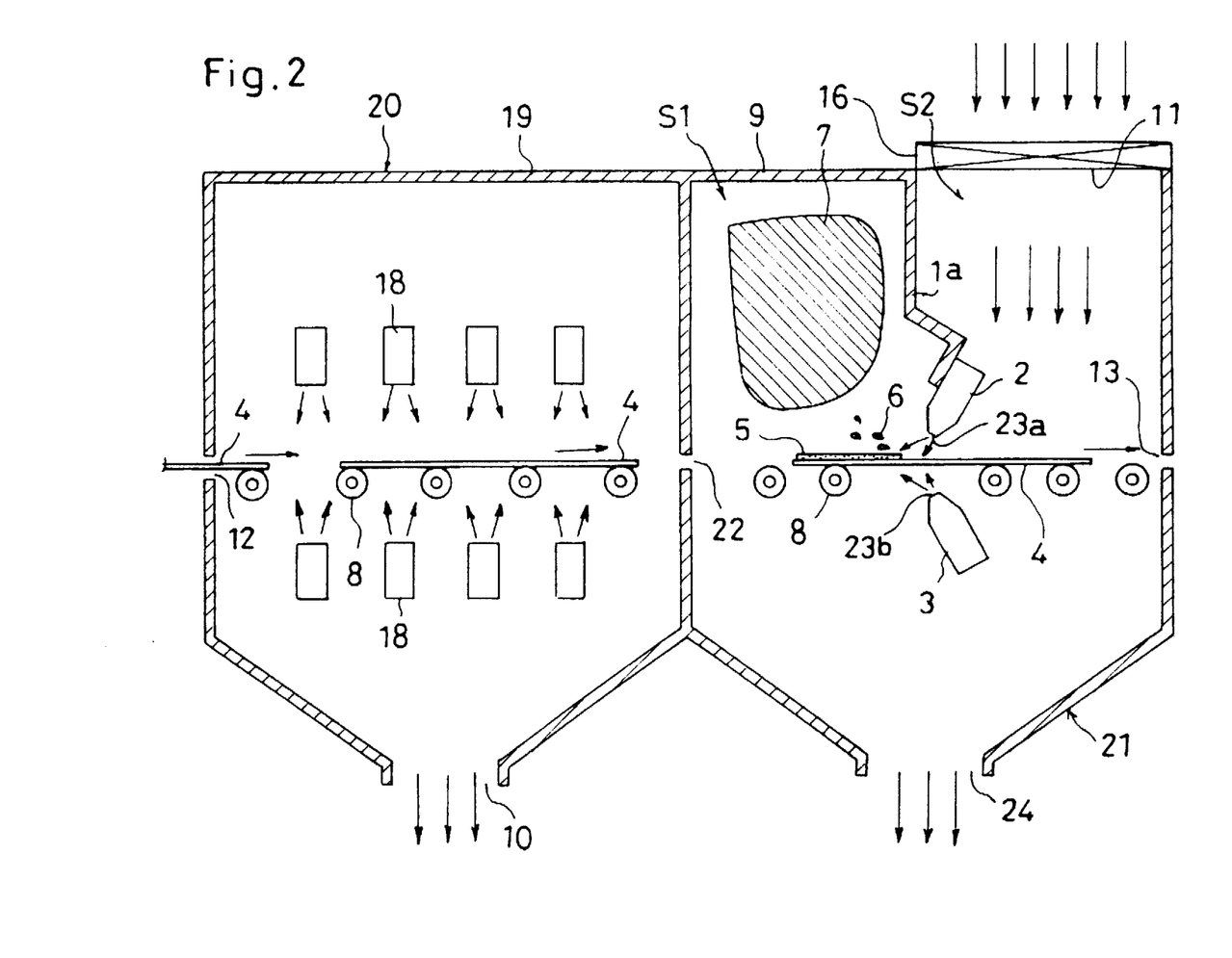
FIG. 2 is a side view of a first embodiment of this invention.

Referring to FIG. 2, a cleaning apparatus 20 has a cleaning chamber 19 defining a substrate inlet 12 and a communicating opening 22. A plurality of transport rollers 8 are arranged in the cleaning chamber 19 for supporting substrates 4 in horizontal posture. A plurality of nozzles 18 are also arranged in the cleaning chamber 19 for supplying a cleaning liquid such as deionized water to opposite surfaces of substrates 4 transported in the direction indicated by arrows. A liquid removing apparatus 21 has a liquid removing chamber 9 for receiving cleaned substrates 4 transported by the transport rollers 8 through the communicating opening 22 acting as a substrate inlet to the liquid removing apparatus 21. The liquid removing chamber 9 includes a first air knife 2 and a second air knife 3 for blowing a gas to the opposite surfaces of substrates 4 transported by the transport rollers 8, to remove the cleaning liquid from the opposite substrate surfaces.

The substrates 4 are square glass substrates, for example. Each substrate 4 has a length of one side in the range of 200 mm to 500 mm, and a thickness approximately 1.1 mm or 0.7 mm.

The cleaning apparatus 20 will be described first. The transport rollers 8 in the cleaning apparatus 20 support the substrates 4 in horizontal posture, and transport the substrates 4 in the direction indicated by the arrows, at a constant velocity in the range of 0.6 m/min. to 1.5 m/min., for example. These transport rollers 8 are arranged parallel to one another in the direction of substrate transport, and drivably connected to a motor not shown, through a chain or the like (not shown). Preferably, the transport rollers 8 are shaped to contact only opposite edges of each substrate 4 in order to minimize contamination through contact with the substrate 4. The nozzles 18 are arranged in the cleaning chamber 19, above and below the substrates 4 transported by the transport rollers 8, to supply the cleaning liquid such as deionized water to the opposite surfaces of substrates 4 transported by the transport rollers 8. The cleaning chamber 19 contains therein the cleaning liquid supplied from the nozzles 18, and prevents ambient particles from entering chamber 19. The cleaning chamber 19 also has substrate inlet 12 defined in a wall upstream with respect to the direction of substrate transport. The cleaning apparatus 20 receives substrates 4 through this inlet 12. The communicating opening 22 is defined in a wall of the cleaning chamber 19 downstream with respect to the direction of substrate transport. The substrates 4, after the cleaning treatment, are transported through this opening 22 from the cleaning chamber 19 to the liquid removing chamber 9. The cleaning chamber 19 defines a first exhaust opening 10 in a bottom region thereof for exhausting air therefrom by means of an exhaust device not shown. The first exhaust opening 10 also allows drainage of the cleaning liquid flowing downward through the cleaning chamber 19.

The liquid removing apparatus 21 will be described next. The transport rollers 8 of the liquid removing apparatus 21 are driven together with the transport rollers 8 of the cleaning apparatus 20. The first air knife 2 in the liquid removing chamber 9 corresponds to the first gas jetting device of this invention. The first air knife 2 is disposed above the substrates 4 transported by the transport rollers 8 to jet a gas such as air or nitrogen gas to the upper surface of each substrate 4. Cleaning liquid 5 adhering to the upper surface, i.e. a first main surface, of substrate 4 is blown away therefrom by the pressure of the gas.

The second air knife 3 corresponding to the second gas jetting device of this invention is disposed below the substrates 4 transported by the transport rollers 8 and opposed to the first air knife 2. The second air knife 3 jets the gas to the lower surface, i.e. a second main surface, of each substrate 4. The cleaning liquid adhering to the lower surface of substrate 4 is blown away therefrom by the pressure of the gas.

The first air knife 2 and second air knife 3 have the same configuration, and each is formed of opposed plates joined together and tapered toward a tip end thereof. The first and second air knives 2 and 3 define a first slit-shaped jet opening 23a and a second slit-shaped jet opening 23b, respectively, to jet out, in strip form, the gas supplied from a gas source not shown. The first jet opening 23a and second jet opening 23b have a length larger than a width of the substrates 4 in a direction perpendicular to the direction of substrate transport to blow the gas uniformly over the opposite surfaces of each substrate 4.

Preferably, the pressure for jetting the gas from each of the first air knife 2 and second air knife 3 is in the range of 0.8 kg/cm$^2$ to 1.4 kg/cm$^2$ in order to assure that cleaning liquid 5 will be removed from the opposite surfaces of substrate 4. Further, in order to reduce the time needed for the liquid removing treatment, the gas such as air or nitrogen gas may be heated by a heater not shown, before jetting from the first and second air knives 2, 3 to the opposite surfaces of substrate 4.

The first and second air knives 2, 3 are inclined relative to the substrate 4. That is, each of the air knives 2 and 3 is disposed at 60 degrees to the direction of substrate transport, whereby gas is jetted from each air knife toward an upstream position (leftward in FIG. 2) with respect to the direction of substrate transport.

The gas may be jetted constantly from the first and second air knives 2, 3 under control of a control device (not shown). Alternatively, gas may be jetted intermittently, i.e. stopped when a substrate 4 is not present between the first and second air knives 2, 3.

The liquid removing chamber 9 contains therein the cleaning liquid blown away from opposite surfaces of substrate 4, and prevents entry of particles from the ambient. The liquid removing chamber 9 defines a substrate outlet 13 in a rear wall thereof disposed downstream with respect to the direction of substrate transport, through which the substrates 4 stripped of liquid are transported outside the liquid removing chamber 9.

The liquid removing chamber 9 defines a second exhaust opening 24 in a bottom region thereof for exhausting air therefrom by means of an exhaust device not shown. The second exhaust opening 24 also allows drainage of the cleaning liquid scattering from the opposite surfaces of substrates 4 and flowing downward through the liquid removing chamber 9, as well as discharge of mist 7 of the cleaning liquid and particles floating in the liquid removing chamber 9.

The liquid removing chamber 9 includes a partition 1a corresponding to the first partition of this invention. The partition 1a has a lower end thereof attached to the first air knife 2 by bolts (not shown), and an upper end attached to an upper wall of the liquid removing chamber 9 such as by welding. The partition 1a extends transversely of the direction of substrate transport (i.e. in a direction perpendicular to the sheet of FIG. 2) between opposite side walls of the liquid removing chamber 9.

A draft gas opening 11 corresponding to the draft gas device of this invention is defined in the upper wall of the liquid removing chamber 9 and above a second space S2.

Generally, liquid crystal displays and the like are manufactured in a cleanroom. Any particles floating above substrates processed by varied manufacturing devices installed in the cleanroom would be entrained by gas flows within the cleanroom to adhere to and contaminate the substrates. To prohibit particles from floating above the substrates being processed, gentle gas downflows are supplied uniformly through the cleanroom. The draft gas opening 11 allows such downflows to enter the liquid removing chamber 9 and flow downward through the second space S2.

A filter 16 extends over the draft gas opening 11 to purify the downflows entering the liquid removing chamber 9. The filter 16 may be omitted where the downflows are sufficiently pure.

According to the apparatus in the first embodiment of the invention, the partition 1a extends from the first air knife 2 to the upper wall of the liquid removing chamber 9, and between the opposite side walls thereof. Consequently, the partition 1a reliably prevents mist 7 floating in a first space S1 from entering the second space S2. That is, the space above each substrate 4 is closed tight by the partition 1a except a gap between the first jet opening 23a of the first air knife 2 and the upper surface of substrate 4, thereby reliably preventing mist 7 from entering the second space S2.

Figure 3:
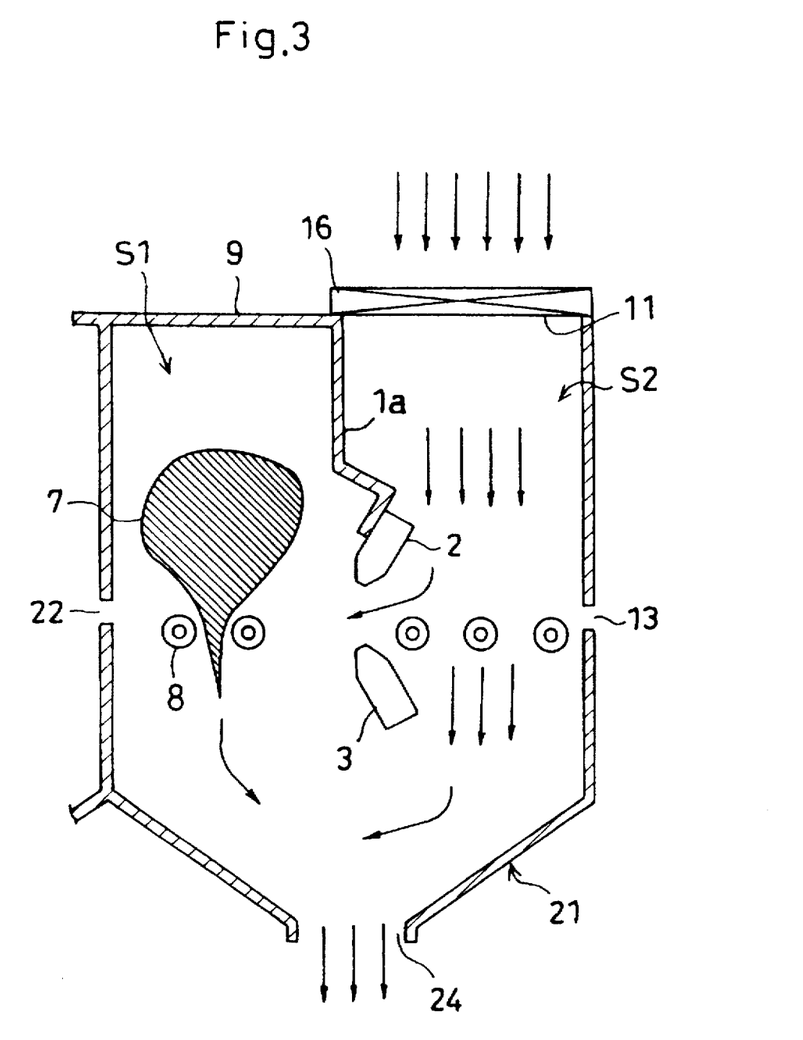
FIG. 3 is a side view of the liquid removing apparatus shown in FIG. 2, in a standby state.

FIG. 3 is a side view of the apparatus in the first embodiment in a standby state. This state takes place after one substrate 4 is transported through the position between the first and second air knives 2, 3 and before a next substrate 4 is brought to that position, with the gas not jetting from the first or second air knives 2, 3.

As shown in FIG. 3, the downflows entering through the draft gas opening 11 produce gas flows directed upstream with respect to the direction of substrate transport (i.e. leftward in FIG. 3) in the space between the first air knife 2 and second air knife 3 and in a space below the second air knife 3. These gas flows prevent mist 7 from entering the second space S2 through the spaces between the first air knife 2 and second air knife 3 and below the second air knife 3.

The downflows entering the second space S2 through the draft gas opening 11 are exhausted through the second exhaust opening 24. Thus, the second space S2 is constantly filled with downflows of clean air to protect substrates 4 that are stripped of liquid from being contaminated by particles in the liquid removing chamber 9.

When the liquid removing chamber 9 and partition 1a having the functions described above, are charged with static electricity, the particles floating in the liquid removing chamber 9 adhere to inner walls of the liquid removing chamber 9 and to the partition 1a. Such particles accumulate thereon with an increase in the number of substrates 4 treated by the liquid removing apparatus 21. Particles that accumulate could be thrown upward by the gas flows in the liquid removing chamber 9, and adhere to and contaminate the surfaces of substrates 4 stripped of the liquid. It is therefore preferable that the liquid removing chamber 9 and partition 1a are formed of a material such as polyvinyl chloride (PVC) that has undergone antistatic treatment.

An operation of the apparatus in the first embodiment will now be described. Each substrate 4 is transported into the cleaning chamber 19 through the substrate inlet 12. The substrate 4 is supported in horizontal posture and transported in the direction of the horizontal arrows (left to right in FIG. 2) by the transport rollers 8. As the substrate 4 is transported by the transport rollers 8, the cleaning liquid such as deionized water is sprayed from the nozzles 18 to clean the substrate 4. The cleaning liquid sprayed to the substrate 4 and flowing down through the cleaning chamber 19, and air in the cleaning chamber 19, are discharged through the first exhaust opening 10.

The cleaned substrate 4, with the cleaning liquid adhering to the opposite surfaces thereof, is transported from the cleaning chamber 19 to the liquid removing chamber 9 through communicating opening 22. The substrate 4 supplied to the liquid removing chamber 9 is transported by the transport rollers 8. Gas is jetted from the first and second air knives 2, 3 to the opposite surfaces of substrate 4 that is being transported through chamber 9, to blow the cleaning liquid away therefrom. The substrate 4 stripped of the cleaning liquid is transported out of the liquid removing chamber 9 through the substrate outlet 13.

Cleaning liquid 5 adhering to the upper surface of substrate 4 is blown away therefrom by the gas jetting from the first air knife 2, to scatter above the substrate 4. Scattering cleaning liquid 6 forms mist 7 floating in the first space S1 in the liquid removing chamber 9. The partition 1a prevents the floating mist 7 flowing from the first space S1 to the second space S2. Since the mist 7 does not float above the substrate 4 stripped of the cleaning liquid, the upper surface of substrate 4 is free from adhesion and contamination by the mist 7 entrained by the gas flows in the liquid removing chamber 9.

The cleaning liquid adhering to the lower surface of substrate 4 is blown away therefrom by the gas jetting from the second air knife 3, to scatter below the substrate 4 and form mist. The air in the liquid removing chamber 9 is drawn through the second exhaust opening 24 by an exhaust device (not shown). Consequently, downward gas flows are produced in the liquid removing chamber 9. The mist formed below the substrate 4 is entrained by the downward gas flows to exit through the second exhaust opening 24. Since the mist does not remain in the liquid removing chamber 9, the substrate 4 is free from adhesion of the mist.

The air including mist 7 in the liquid removing chamber 9 and the cleaning liquid removed from the opposite surfaces of substrate 4 are discharged from the liquid removing chamber 9 through the second exhaust opening 24.

Modification of the First Embodiment

Figure 4:
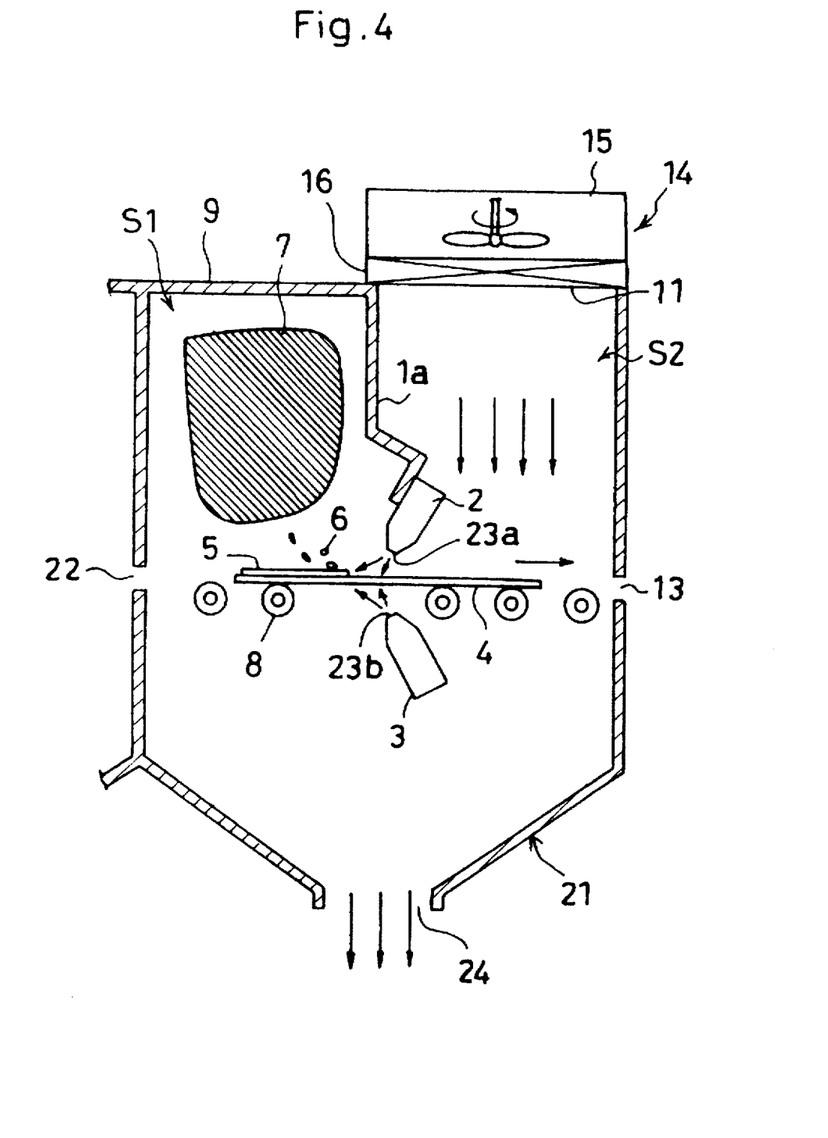
FIG. 4 is a side view of a modification of the first embodiment.

A modification of the first embodiment is illustrated in FIG. 4 which is a side view of the modification, in which like reference numerals are used to identify like parts in FIG. 2. Though not shown in FIG. 4, the same cleaning apparatus 20 as shown in FIG. 2 is disposed forwardly of the communicating opening 22.

This modification includes a fan 15 disposed above the filter 16. The fan 15, filter 16 and draft gas opening 11 constitute a draft gas mechanism 14 corresponding to the draft gas device of this invention. The fan 15 collects clean air above the liquid removing chamber 9, and feeds the air into the second space S2 through the filter 16 and draft gas opening 11. The fan 15 has a rotational frequency controllable by a rotation control device (not shown), to adjust a flow rate of air supplied to the second space S2. Thus, air flows may be supplied at an appropriate flow rate according to a surface condition of substrate 4 stripped of the cleaning liquid.

In the first embodiment and the modification thereof described above, the upper end of the partition 1a is in contact with the upper wall of the liquid removing chamber 9. The same effect is produced where the upper end of the partition 1a is in contact with a front wall (defining the communicating opening 22) of the liquid removing chamber 9. The upper end of the partition 1a may be placed in contact with the rear wall (defining the substrate outlet 13) of the liquid removing chamber 9.

Second Embodiment

Figure 5:
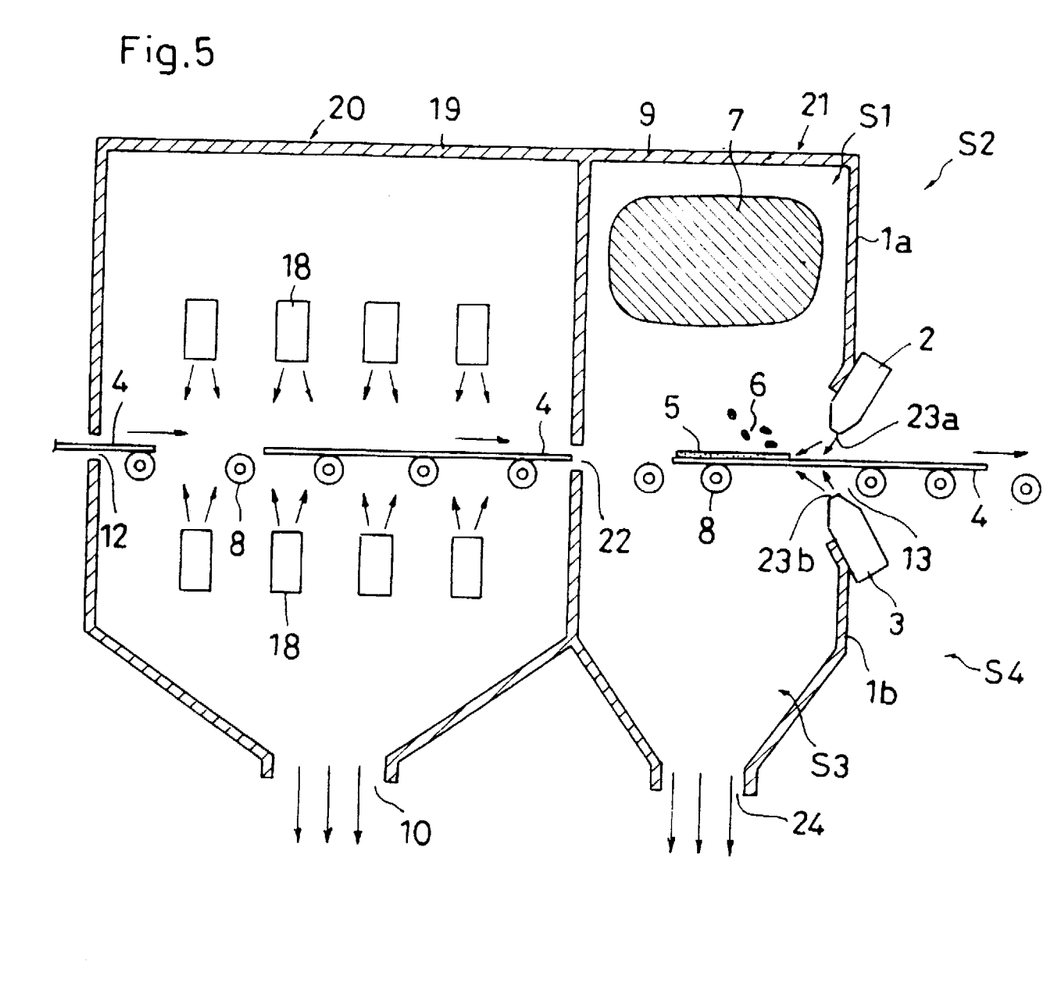
FIG. 5 is a side view of a second embodiment of this invention.

FIG. 5 is a side view of a second embodiment of this invention, in which like reference numerals are used to identify like parts in FIG. 2. The second embodiment includes a second partition 1b for dividing the space below the substrate 4 in the liquid removing chamber 9, besides the first partition 1a for dividing the space above the substrate 4. The first partition 1a and second partition 1b act also as the rear wall (rightward wall in FIG. 5) of the liquid removing chamber 9.

That is, the first partition 1a acts as an upper portion of the rear wall of the liquid removing chamber 9, and the first air knife 2 is attached to a lower end of the first partition 1a. The second partition 1b acts as a lower portion of the rear wall of the liquid removing chamber 9, and the second air knife 3 is attached to an upper end of the second partition 1b. As in the first embodiment, the first and second partitions 1a and 1b extend transversely of the direction of substrate transport (i.e. in a direction perpendicular to the sheet of FIG. 5) between the opposite side walls of the liquid removing chamber 9. A substrate outlet 13 is provided by a vertical space between the first and second air knives 2, 3, through which substrates 4 stripped of the cleaning liquid are discharged from the apparatus.

With the first and second partitions 1a and 1b, the space above the substrate 4 in the liquid removing chamber 9 is divided into the first space S1 and second space S2, and the space below the substrate 4 is divided into a third space S3 and a fourth space S4. The second space S2 and fourth space S4 correspond to outside spaces rearwardly of the liquid removing chamber 9. Thus, mist 7 floating in the first space S1 and mist floating in the third space S3 are prevented from entering the second space S2 and fourth space S4. Consequently, the substrates 4 are free from adhesion of the mist. With the two partitions 1a and 1b acting as the rear wall of the liquid removing chamber 9, the apparatus in this embodiment has an advantage of being a simplified construction requiring a reduced number of components.

Modification of the Second Embodiment

Figure 6:
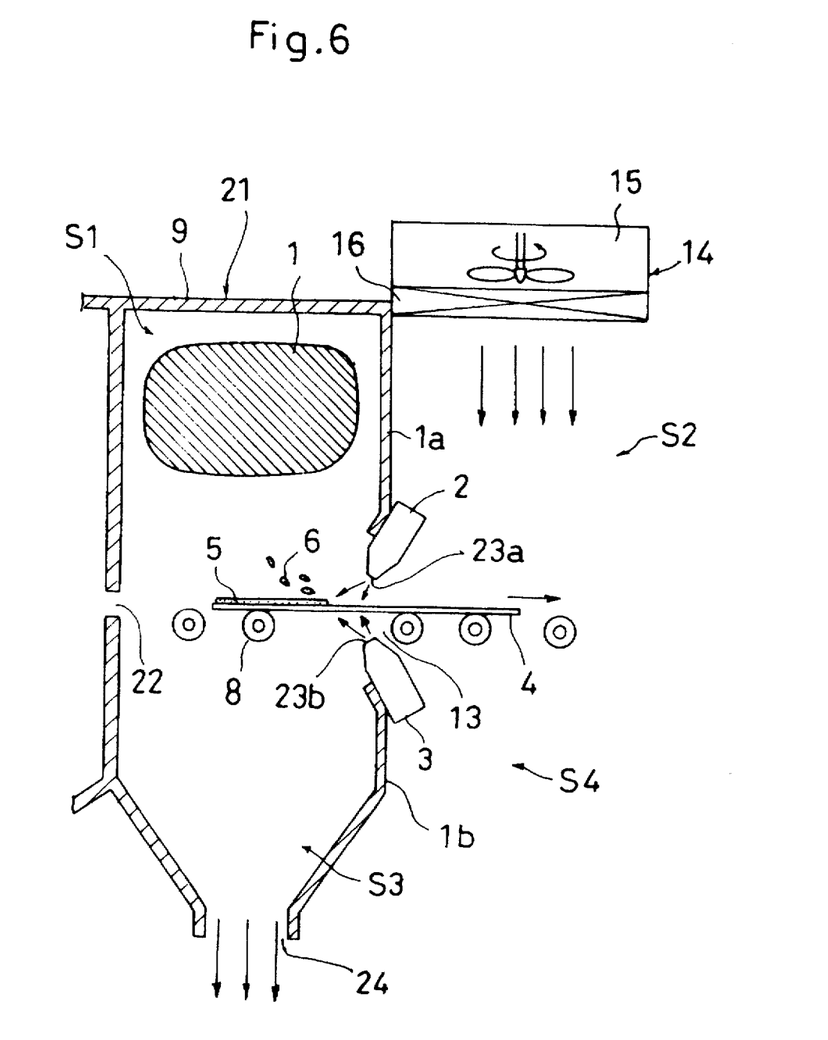
FIG. 6 is a side view of a modification of the second embodiment.

A modification of the second embodiment is illustrated in FIG. 6 that is a side view of the modification, in which like reference numerals are used to identify like parts in FIG. 5. Though not shown in FIG. 6, the same cleaning apparatus 20 as shown in FIG. 5 is disposed forwardly of the communicating opening 22.

This modification additionally provides a draft gas mechanism 14 disposed above the second space S2. The draft gas mechanism 14 corresponds to the draft gas device of this invention, and includes a fan 15 and a filter 16. A region right under this filter 16 corresponds to the draft gas opening 11 in the first embodiment. The fan 15 collects downflows of clean air above the liquid removing chamber 9 in the cleanroom, and feeds the air into the second space S2 through the filter 16. As in the modification of the first embodiment (FIG. 4) described hereinbefore, the fan 15 has a rotational frequency controllable to adjust a flow rate of air supplied to the second space S2. Thus, air flows may be supplied at an appropriate flow rate according to a surface condition of substrate 4 stripped of the cleaning liquid.

Third Embodiment

Figure 7:
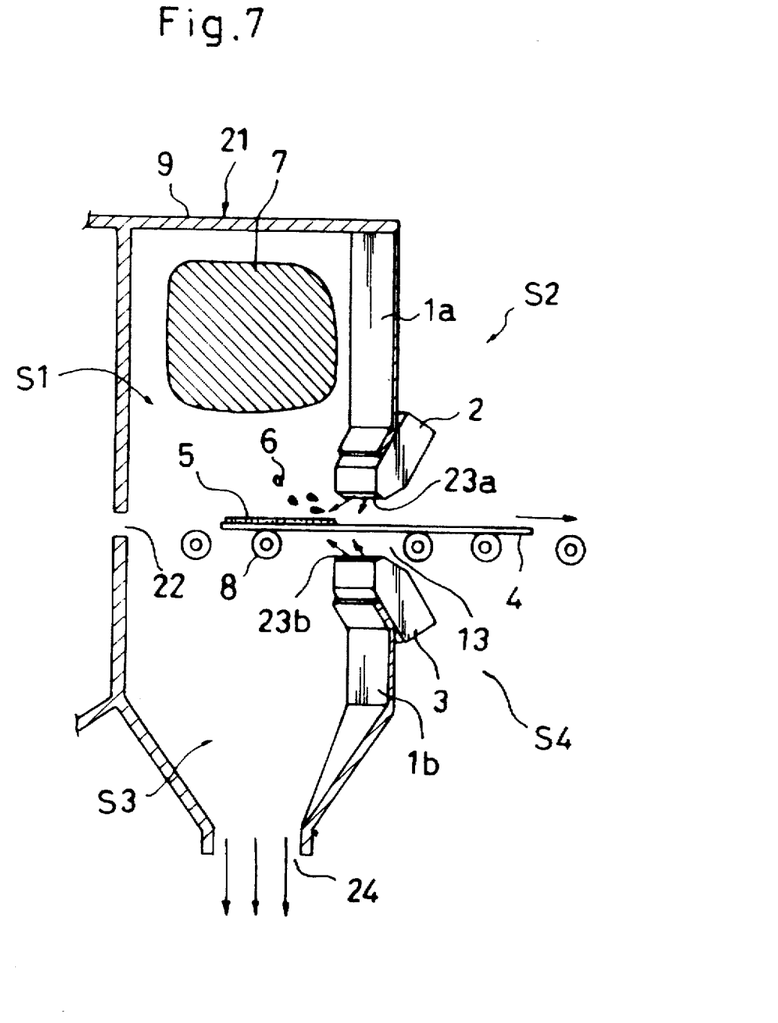
FIG. 7 is a side view of a third embodiment of this invention.

FIG. 7 is a side view of a third embodiment of this invention, in which like reference numerals are used to identify like parts in FIG. 5. Though not shown in FIG. 7, the same cleaning apparatus 20 as shown in FIG. 5 is disposed forwardly of the communicating opening 22.

In the third embodiment, the first and second air knives 2, 3 are arranged in the liquid removing chamber 9 at a predetermined angle to a line extending perpendicular to the direction of substrate transport. Specifically, the first partition 1a acting as the rear wall of the liquid removing chamber 9 is disposed at an angle (e.g. 7 degrees), in plan view, to the front wall (defining the communicating opening 22). The second partition 1b is disposed at the same angle.

Figure 8:
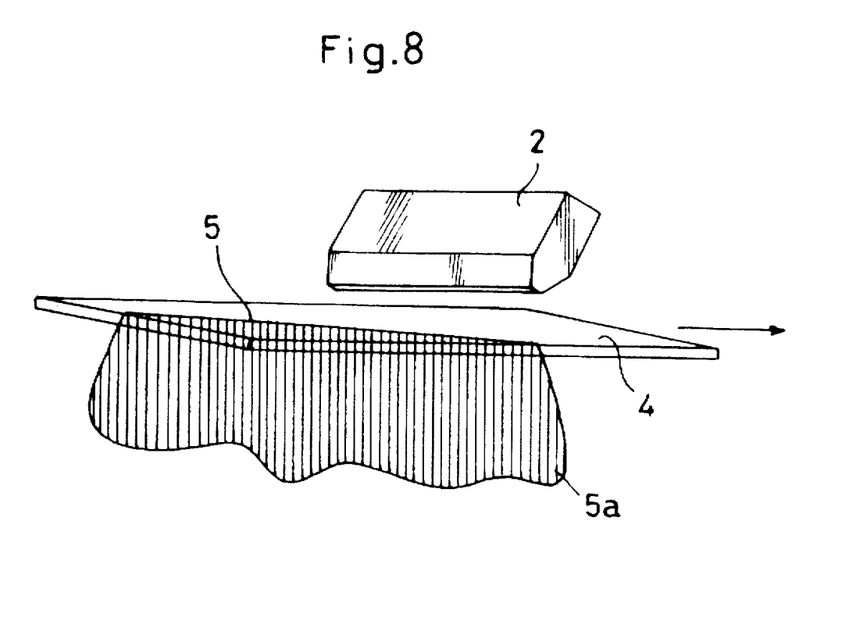
FIG. 8 is a schematic view showing a liquid removing treatment in the third embodiment.

Thus, the first and second air knives 2, 3 are inclined at the predetermined angle. Consequently, as shown schematically in FIG. 8, schematically cleaning liquid 5 on the upper surface of each substrate 4 is driven to one corner of substrate 4 to flow down from corner regions as at 5a. In this way, cleaning liquid 5 is removed efficiently from the upper surface of substrate 4.

In the first and second embodiments, as in the third embodiment, the first and second air knives 2, 3 may be arranged at a predetermined angle (e.g. 7 degrees) to the line extending perpendicular to the direction of substrate transport.

In the first to third embodiments, the transport device (transport rollers 8) transports substrates 4 in horizontal posture. Instead, the substrates 4 may be transported in a posture inclined transversely of the direction of substrate transport. According to this modification, the cleaning liquid flows down the slope of each substrate 4 naturally to a certain extent. This will assist the gas jetting from the first air knife 2 and second air knife 3 in removing the cleaning liquid efficiently.

The liquid removing apparatus according to this invention is suited for use also in removing a developer supplied to substrates for developing resist film exposed through a mask having a predetermined pattern, an etching solution supplied to substrates for etching metallic film formed thereon, and a separating solution supplied to substrates for separating photoresist film therefrom.

The substrates treated by the apparatus according to this invention may be elongate materials for use in manufacturing shadow masks for color picture tubes or lead frames for semiconductor devices, for example. A gas may be jetted from the gas jetting devices to surfaces of such elongate metal sheets transported in a longitudinal direction thereof, to remove a treating liquid therefrom.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for removing a treating liquid from main surfaces of a substrate having undergone wet surface treatment, said apparatus comprising:
    transport means for supporting said substrate in horizontal posture and transporting said substrate in a direction along said main surfaces thereof;
    first gas jetting unit having a first jet opening for jetting a gas to a first main, upper surface of said substrate transported by said transport means;
    an approximately box-shaped liquid removing chamber for preventing said treating liquid removed from said main surfaces of said substrate from scattering to ambient, said liquid removing chamber having a substrate inlet and a substrate outlet; and
    a first partition mounted in said liquid removing chamber and having an upper end thereof contacting one wall of a group of walls consisting of an upper wall, a rear wall and a front wall of said liquid removing chamber, said first partition extending between opposite side walls of said liquid removing chamber parallel to a direction of substrate transport to divide an interior space above said first main surface of said substrate into a first space upstream of said first jet opening with respect to said direction of substrate transport, and a second space downstream of said first jet opening with respect to said direction of substrate transport.

2. An apparatus as defined in claim 1, further comprising second gas jetting unit having a second jet opening for jetting the gas to a second main, lower surface of said substrate transported by said transport means, and a second partition mounted in said liquid removing chamber and having a lower end thereof contacting one wall of a group of walls consisting of a lower wall, said rear wall and said front wall of said liquid removing chamber, said second partition extending between said opposite side walls to divide an interior space below said main surface of said substrate into a third space upstream of said second jet opening with respect to said direction of substrate transport, and a fourth space downstream of said second jet opening with respect to said direction of substrate transport.

3. An apparatus as defined in claim 2, wherein said first and said second jet openings each have a length larger than a width of said substrate in a direction perpendicular to said direction of substrate transport.

4. An apparatus as defined in claim 2, further comprising draft gas device for supplying gas flows downward to said second space.

5. An apparatus as defined in claim 4, wherein said draft gas device includes a draft gas opening formed above said second space, and a filter mounted at said draft gas opening.

6. An apparatus as defined in claim 5, wherein said draft gas device further includes a fan for feeding air through said filter.

7. An apparatus as defined in claim 2, wherein said liquid removing chamber includes an exhaust opening for discharging air therefrom.

8. An apparatus as defined in claim 2, wherein said first partition defines an upper portion of said rear wall above a plane of substrate transport, and said second partition defines a lower portion of said rear wall below said plane of substrate transport, said substrate outlet being defined in a space between said first and said second gas jetting units.

9. An apparatus as defined in claim 2, wherein said first and said second gas jetting units are inclined such that said first jet opening and said second jet opening are directed upstream with respect to said direction of substrate transport.

10. An apparatus as defined in claim 2, wherein said first and said second gas jetting units are arranged at an angle to a line extending perpendicular to said direction of substrate transport.

11. An apparatus as defined in claim 2, wherein said liquid removing chamber, said first partition and said second partition are given antistatic treatment.

12. An apparatus as defined in claim 1, wherein said first jet opening has a length greater than a width of said substrate in a direction perpendicular to said direction of substrate transport.

13. An apparatus as defined in claim 1, further comprising a draft gas device for supplying gas flows downward to said second space.

14. An apparatus as defined in claim 13, wherein said draft gas device includes a draft gas opening formed above said second space, and a filter mounted at said draft gas opening.

15. An apparatus as defined in claim 14, wherein said draft gas device further includes a fan for feeding air through said filter.

16. An apparatus as defined in claim 13, wherein said liquid removing chamber includes an exhaust opening for discharging air therefrom.

17. An apparatus as defined in claim 1, wherein said liquid removing chamber includes an exhaust opening for discharging air therefrom.

18. An apparatus as defined in claim 1, wherein said first gas jetting device is inclined such that said first jet opening is directed upstream with respect to said direction of substrate transport.

19. An apparatus as defined in claim 1, wherein said first gas jetting device is arranged at a predetermined angle to a line extending perpendicular to said direction of substrate transport.

20. An apparatus as defined in claim 1, wherein said liquid removing chamber and said first partition are given antistatic treatment.

* * * * *